(12) United States Patent
Lee

(10) Patent No.: US 7,991,366 B2
(45) Date of Patent: Aug. 2, 2011

(54) METHODS AND APPARATUS FOR RECONSTRUCTING AMPLITUDE MODULATION SIGNALS IN POLAR MODULATION TRANSMITTERS

(75) Inventor: Wayne S. Lee, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 634 days.

(21) Appl. No.: 12/123,611

(22) Filed: May 20, 2008

(65) Prior Publication Data

US 2009/0291648 A1    Nov. 26, 2009

(51) Int. Cl.
  *H03C 1/52* (2006.01)
  *H04B 1/04* (2006.01)
(52) U.S. Cl. ............. 455/108; 455/110; 455/114.3; 375/298; 375/300; 332/145; 332/159; 330/149
(58) Field of Classification Search .......... 455/108, 455/110, 114.3; 375/296, 297, 298, 300, 375/302; 332/145, 159; 330/149
  See application file for complete search history.

(56) References Cited

U.S. PATENT DOCUMENTS

| | | | | |
|---|---|---|---|---|
| 5,598,436 A | * | 1/1997 | Brajal et al. ............. | 375/297 |
| 6,101,224 A | * | 8/2000 | Lindoff et al. ............ | 375/300 |
| 6,295,442 B1 | * | 9/2001 | Camp et al. .............. | 455/102 |
| 6,937,668 B2 | * | 8/2005 | Sridharan et al. ......... | 375/296 |
| 7,269,232 B2 | * | 9/2007 | Gagey et al. ............. | 375/300 |
| 7,277,497 B2 | * | 10/2007 | Hietala et al. ............ | 375/302 |
| 7,535,310 B2 | * | 5/2009 | Shimizu et al. ........... | 332/103 |
| 7,715,808 B2 | * | 5/2010 | Shimizu et al. ........... | 455/108 |
| 7,801,244 B2 | * | 9/2010 | Hietala .................... | 375/296 |
| 7,822,389 B2 | * | 10/2010 | Muhammad et al. ...... | 455/78 |
| 2009/0252255 A1 | * | 10/2009 | Lee et al. ................. | 375/297 |
| 2010/0081397 A1 | * | 4/2010 | Lee et al. ................. | 455/108 |

* cited by examiner

*Primary Examiner* — Duc M Nguyen

(57) ABSTRACT

Methods and apparatus for reconstructing discrete-time amplitude modulation signals in polar modulation transmitters. An exemplary polar modulation transmitter includes a symbol generator, a rectangular-to-polar converter, a peak phase detector, and an amplitude modulation reconstruction circuit. The symbol generator generates rectangular-coordinate modulation symbols from which the rectangular-to-polar converter generates an amplitude modulation signal containing discrete-time amplitude samples and an angle modulation signal containing discrete-time angle samples. The peak phase detector circuit detects phase reversals or near phase reversals represented in samples of the angle modulation signal. The amplitude modulation reconstruction circuit responds by reconstructing samples in the amplitude modulation signal that correspond to detected phase reversals or a near phase reversals represented in samples of the angle modulation signal.

20 Claims, 8 Drawing Sheets

RECTANGULAR-TO-POLAR CONVERSION

US 7,991,366 B2

METHODS AND APPARATUS FOR RECONSTRUCTING AMPLITUDE MODULATION SIGNALS IN POLAR MODULATION TRANSMITTERS

FIELD OF THE INVENTION

The present invention relates to processing signals in communications transmitters. More specifically, the present invention relates to methods and apparatus for increasing the accuracy of signals in polar modulation transmitters.

BACKGROUND OF THE INVENTION

In an effort to increase spectral efficiency, many state-of-the-art communications systems, including third generation (3G) cellular communications systems such as EDGE (Enhanced Data rates for GSM Evolution) and W-CDMA (Wideband Code Division Multiple Access), employ modulation schemes that produce non-constant-envelope signals. In a traditional quadrature-modulator-based transmitter, the levels of these non-constant-envelope signals are reduced before being introduced to the transmitter's power amplifier (PA), and the PA is configured to operate in its linear region of operation to prevent signal clipping. Unfortunately, this results in an undesirable trade-off between amplifier linearity and power efficiency.

To avoid the amplifier linearity versus power efficiency trade-off, an alternative type of communications transmitter known as a polar modulation transmitter may be used. FIG. 1 is a simplified drawing of a typical polar modulation transmitter 100. The polar modulation transmitter 100 comprises an amplitude modulator 102, a phase modulator 104, and a power amplifier (PA) 106. The amplitude modulator 102 is operable to modulate a direct current power supply signal Vsupply according to envelope information contained in an amplitude modulation (AM) signal received in an AM path of the polar modulation transmitter 100, to generate an amplitude modulated power supply signal VDD(t). Meanwhile, the phase modulator 104 operates to modulate a carrier signal according to angle variations contained in a constant-amplitude phase modulation (PM) signal received in a PM path, to generate a phase modulated carrier signal. The PA 106 is configured to amplify the phase modulated carrier signal while the amplitude modulated power supply signal VDD(t) is applied to a power supply input of the PA 106. Because the phase modulated carrier signal has a constant amplitude, the PA 106 can be implemented as a highly-efficient nonlinear PA 106 without the risk of signal clipping. Typically, the PA 106 is implemented as a switch-mode type of PA (e.g., a Class D, E or F switch-mode PA) configured to operate in compression. Accordingly, the amplitude modulation contained in the amplitude modulated power supply signal VDD(t) is modulated onto the phase modulated carrier signal as the phase modulated carrier signal is amplified by the PA 106.

Another major benefit of the polar modulation transmitter is that its baseband functions can be designed entirely with the use of digital circuits. This allows the design to be fabricated in standard high-yield integrated circuit manufacturing processes, such as the widely used complementary metal-oxide-semiconductor (CMOS) logic process. It also allows digital signal processing techniques to be applied, which are easily adaptable to different modulation standards, thereby providing a multimode capable solution.

FIG. 2 is a drawing of a typical polar modulation transmitter 200 highlighting its digital baseband processing functions. The digital baseband processing functions comprise a baseband processor 202 including a symbol generator 204 and a rectangular-to-polar converter (such as a Coordinate Rotation Digital Computer (CORDIC) converter) 206. The symbol generator 204 functions to generate in-phase (I) and quadrature phase (Q) sequences of symbols from bits in a digital message to be transmitted. The CORDIC converter 206 functions to convert the I and Q sequences of symbols into digital polar-coordinate amplitude and phase modulation signals ρ and θ. After being converted to analog AM and PM signals by AM and PM path digital converters (DACs) 210 and 212, the polar modulation transmitter 200 operates in essentially the same manner as described above in connection with FIG. 1.

Although digitally generating and processing modulation signals in a polar modulation transmitter offers a number of benefits, inaccuracies can occur due to the discrete-time nature of the digital modulation signals. Many existing modulation technologies such as orthogonal frequency division multiplexing (OFDM), and other existing or soon-to-be deployed wireless technologies, such as the Third Generation Partnership Project (3GPP) W-CDMA, Long Term Evolution (LTE) and High-Speed Packet Access (HSPA) technologies that employ wideband signals, exhibit significant signal activity at low magnitudes. When these signals are represented in the form of discrete-time samples, sample-to-sample origin-crossing events occurring in the rectangular-coordinate modulation signal trajectory are not always accurately translated to zero magnitude during the rectangular-to-polar conversion process. This problem is illustrated in FIGS. 3A and 3B, where it is seen that although the rectangular-coordinate modulation signal crosses through the I-Q plane origin in FIG. 3A, after being converted to polar coordinates the magnitude of the amplitude modulation signal ρ never properly reaches zero magnitude, as it should, albeit only for a very brief period of time.

Failing to accurately translate origin-crossing events of a rectangular-coordinate modulation signal to zero magnitude events in the polar domain results in a modulated output signal that incorrectly encircles the I-Q signal plane origin, rather than passing through it, as illustrated in FIG. 4. As shown in FIG. 5, when an origin-encircling event is present, the extra signal energy caused by the signal not crossing through the origin is leaked into adjacent channels 504 (indicated by the dashed lines in the PSD side lobes in the adjacent channels 504). The leaked power can makes it difficult to comply with communications standards specifications such as adjacent channel leakage ratio (ACLR).

It would be desirable, therefore, to have methods and apparatus for addressing inaccuracies produced in polar-coordinate amplitude modulation signals caused from representing the amplitude modulation in the form of discrete-time samples.

SUMMARY OF THE INVENTION

Methods and apparatus for reconstructing discrete-time amplitude modulation signals in polar modulation transmitters are disclosed. An exemplary polar modulation transmitter includes a symbol generator, a rectangular-to-polar converter, a peak phase detector, and an amplitude modulation reconstruction circuit. The symbol generator functions to generate rectangular-coordinate modulation symbols. The rectangular-to-polar converter functions to generate an amplitude modulation signal containing discrete-time amplitude samples and an angle modulation signal containing discrete-time angle samples from the rectangular-to-coordinate modulation symbols. The peak phase detector circuit is configured to detect phase reversals or near phase reversals represented in samples of the angle modulation signal. In response, the amplitude modulation reconstruction circuit operates to reconstruct samples in the amplitude modulation signal that correspond to detected phase reversals or a near phase reversals represented in samples of the angle modulation signal.

Further features and advantages of the present invention, including a description of the structure and operation of the above-summarized and other exemplary embodiments of the invention, are described in detail below with respect to accompanying drawings, in which like reference numbers are used to indicate identical or functionally similar elements.

DETAILED DESCRIPTION

Figure 6:
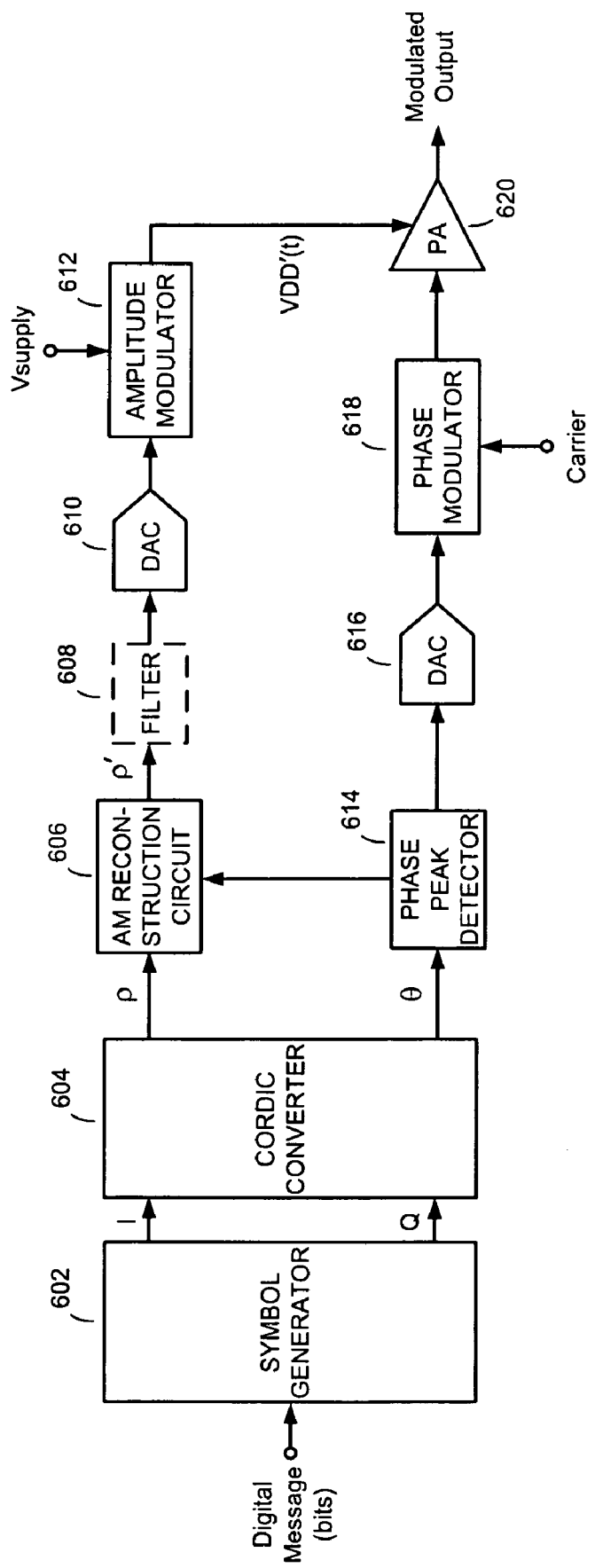
FIG. 6 is a drawing of a polar modulation transmitter, according to an embodiment of the present invention.

Referring to FIG. 6, there is shown a drawing of a polar modulation transmitter 600, according to an embodiment of the present invention. The polar modulation transmitter 600 comprises a symbol generator 602, a rectangular-to-polar converter (such as a Coordinate Rotation Digital Computer (CORDIC) converter) 604; an amplitude modulation (AM) path that includes an AM reconstruction circuit 606, optional low-pass filter (LPF) 608, AM path digital-to-analog converter (DAC) 610 and amplitude modulator 612; a phase path that includes a phase peak detector 614, PM path DAC 616 and phase modulator 618; and a power amplifier (PA) 620.

Figure 1:
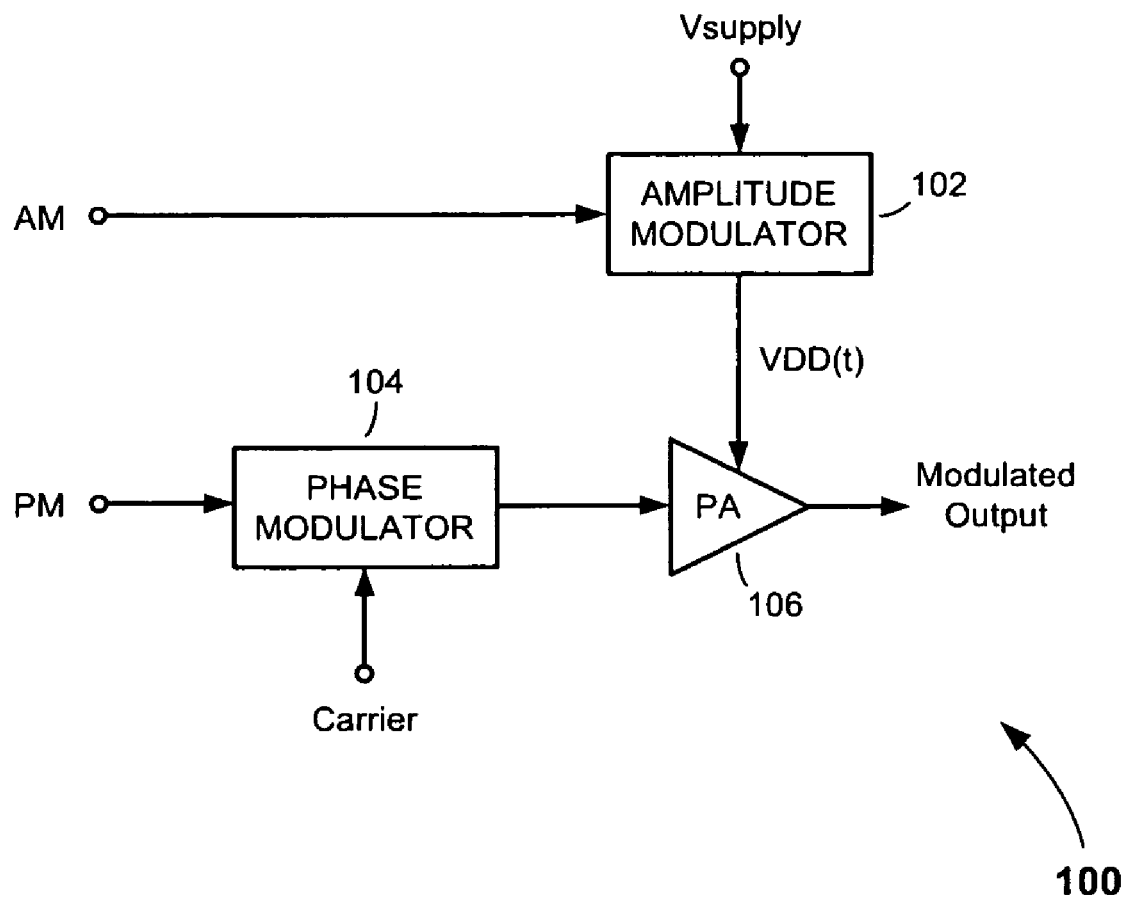
FIG. 1 is a drawing of a typical polar modulation transmitter.
Figure 2:
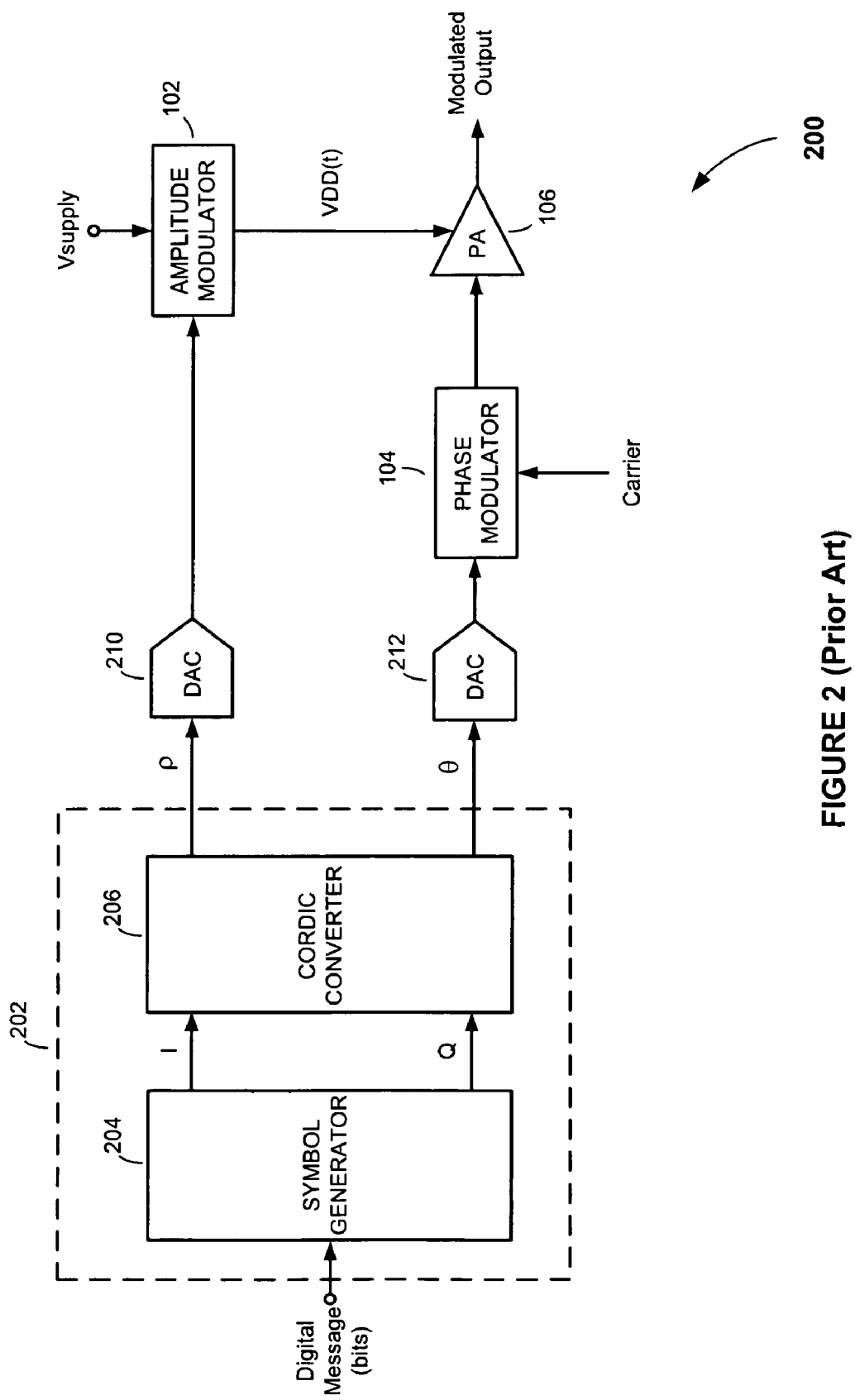
FIG. 2 is a drawing of a typical polar modulation transmitter highlighting its digital baseband processing functions.
Figure 3B:
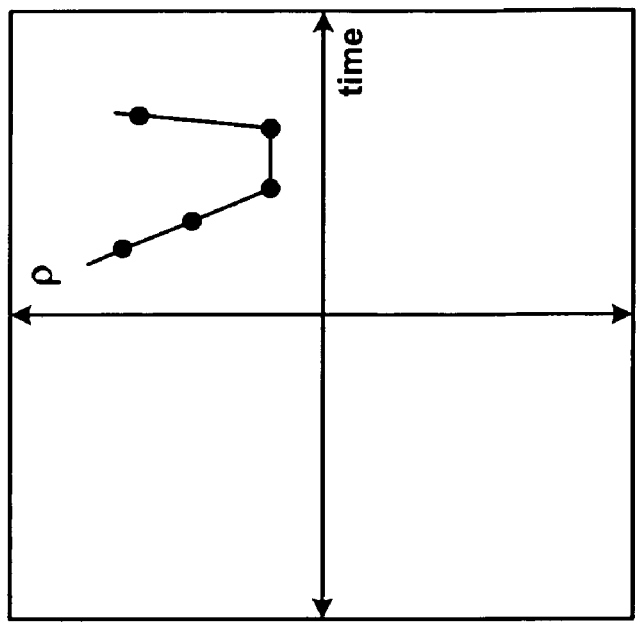
FIG. 3B is a simplified drawing of a polar-coordinate amplitude modulation signal generated from a rectangular-to-polar conversion of samples of the rectangular-coordinate modulation signal shown in FIG. 3A.
Figure 3A:
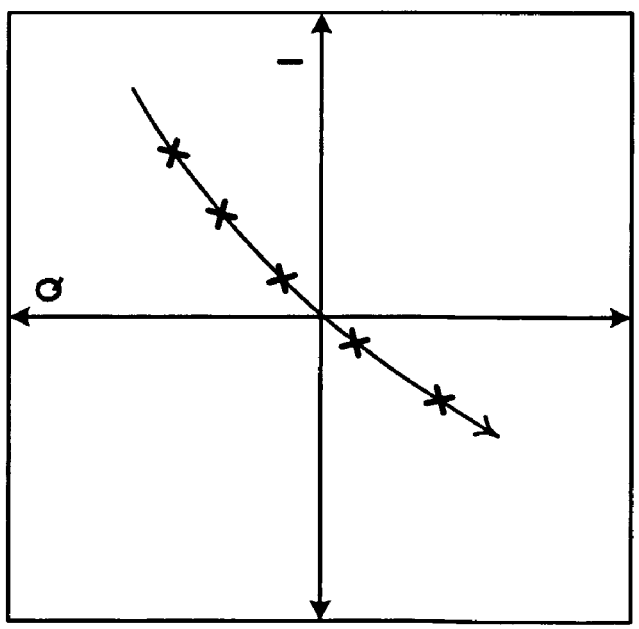
FIG. 3A is a simplified drawing of a time sequence of rectangular-coordinate modulation signal samples having a trajectory that passes through the origin of the I-Q plane.

Similar to the polar modulation transmitter 200 in FIG. 2, the symbol generator 602 of the polar modulation transmitter 600 of the present invention is configured to receive a digital message to be transmitted and generate in-phase (I) and quadrature phase (Q) symbol sequences formatted according to an applicable modulation scheme or standard. The CORDIC converter 604 converts the I and Q sequences of symbols into amplitude and phase modulation signals $\rho$ and $\theta$ comprising discrete-time samples of the sequences of symbols in polar coordinates.

The phase peak detector 614 functions to detect sample-to-sample phase changes in the phase modulation signal $\theta$ that are +180° or −180° (phase reversals) or that exceed some other predetermined maximum and minimum phase thresholds indicative of near phase reversals. The phase peak detector 614 operates under the principle that a phase reversal (or a near phase reversal) corresponds to an origin-crossing event. Accordingly, when the phase peak detector 614 detects a phase reversal (or near phase reversal), it signals the AM reconstruction circuit 606 that a low magnitude event has likely occurred. The AM reconstruction circuit 606, which may be implemented as a state machine or combinatorial logic, for example, responds by reconstructing the amplitude modulation signal $\rho$ so that one or more of its samples in the temporal vicinity of the detected phase reversal (or detected near phase reversal) has or have a zero magnitude. To reduce any spectral regrowth that may be caused by sharp sample-to-sample transitions in the resulting reconstructed amplitude modulation signal $\rho'$, the optional LPF 608 may be employed following the AM reconstruction circuit 606. Because the resulting reconstructed amplitude modulation signal $\rho'$ is free of origin-encircling events, the adjacent channel leakage ratio (ACLR) is improved compared to if no reconstruction had been performed.

Figure 7:
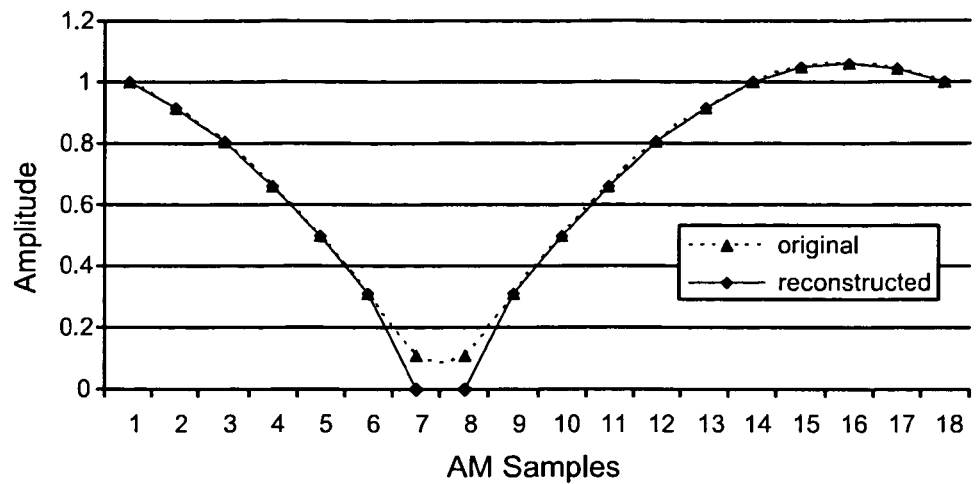
FIG. 7 is a signal diagram comparing an original amplitude modulation signal to a reconstructed amplitude modulation signal that has been reconstructed, according to an embodiment of the invention.

Various different methods of reconstructing the amplitude modulation signal $\rho$ may be used. According to one method, the magnitudes of the two samples in the amplitude modulation signal $\rho$ that correspond to the two phase modulation signal samples surrounding a detected phase reversal (or detected near phase reversal) are forced to zero magnitude. This approach is illustrated in FIG. 7, where samples 7 and 8 of an "original" amplitude modulation signal $\rho$ are forced to zero magnitude, thereby forming a reconstructed amplitude modulation signal $\rho'$ having a trajectory more closely resembling the trajectory of the I-Q modulation signal near the I-Q plane origin.

Figure 8:
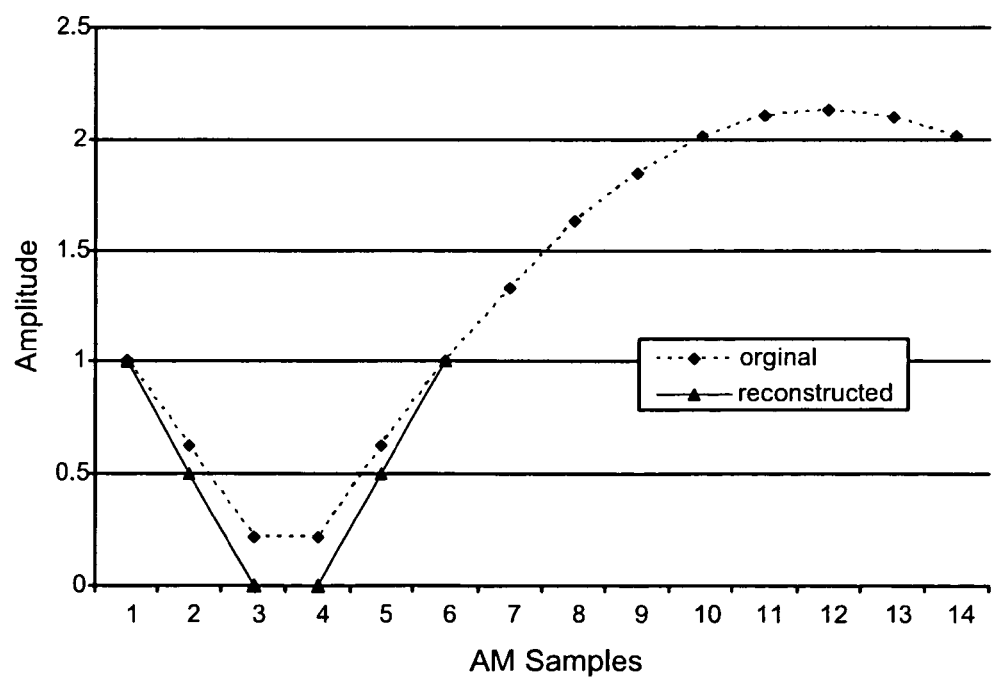
FIG. 8 is a signal diagram comparing an original amplitude modulation signal to a reconstructed amplitude modulation signal that has been reconstructed, according to another embodiment of the invention.

FIG. 8 shows another approach to reconstructing the amplitude modulation signal $\rho$. According to this approach, the AM reconstruction circuit 606 is configured to use four samples from the amplitude modulation signal $\rho$ to form the reconstructed amplitude modulation signal $\rho'$. Similar to the approach in FIG. 7, the magnitudes of the two samples in the amplitude modulation signal $\rho$ that correspond to the two phase modulation signal samples surrounding a detected phase reversal (or near phase reversal) are forced to zero. The two additional samples are used to relax the slew rate of the reconstructed phase modulation signal $\rho'$ so that it transitions more smoothly from sample to sample.

Figure 9:
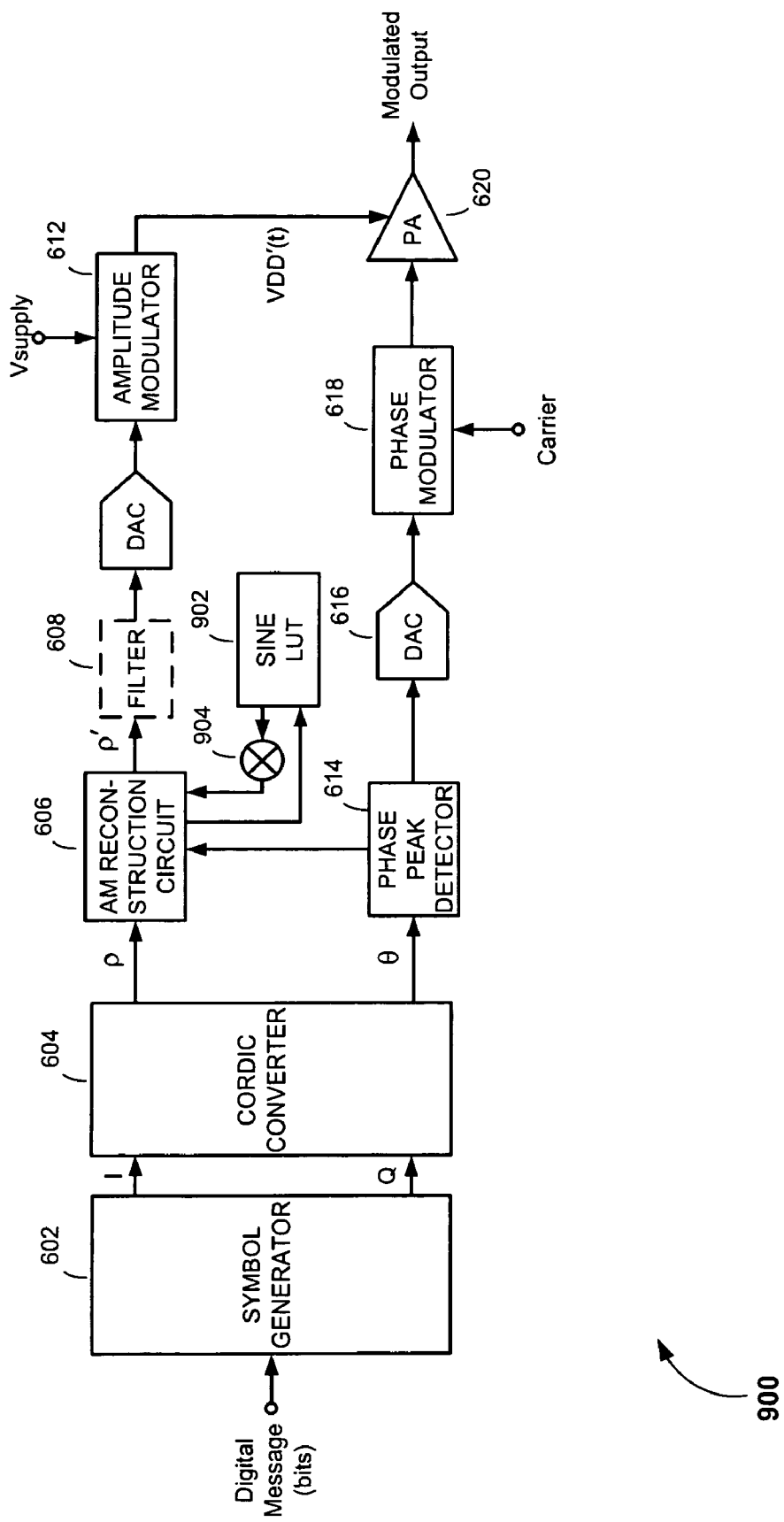
FIG. 9 is a drawing of a polar modulation transmitter, according to another embodiment of the present invention.
Figure 10:
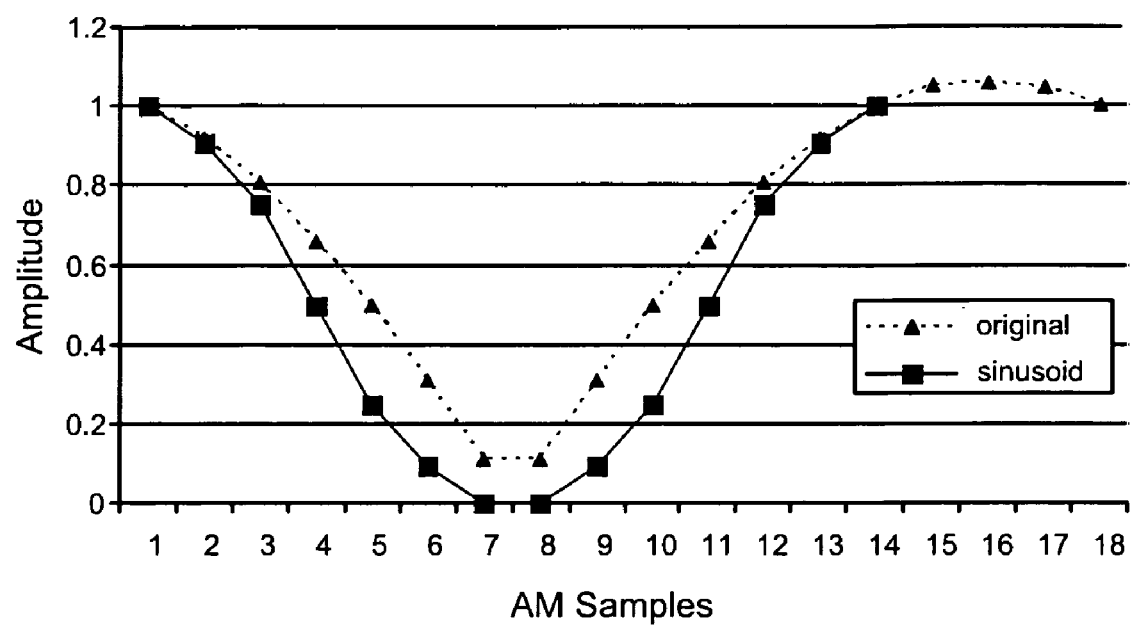
FIG. 10 is a signal diagram comparing an original amplitude modulation signal to a reconstructed amplitude modulation signal that has been reconstructed using the reconstruction circuit of the polar modulation transmitter in FIG. 9.

According to another embodiment of the invention, instead of forcing certain samples to zero to reconstruct the amplitude modulation signal $\rho$, a predetermined number of samples of the amplitude modulation signal $\rho$ are fitted to a piecewise function. FIGS. 9 and 10 illustrate, for example, how the polar modulation transmitter 600 in FIG. 6 is modified and adapted so that the AM reconstruction circuit 606 is operable to fit samples of the amplitude modulation signal $\rho$ to a piecewise sinusoidal function. In response to a signal from the phase peak detector 614 that a phase reversal (or near phase reversal) has been detected between phase modulation signal $\theta$ samples, the AM reconstruction circuit 606 replaces one or more corresponding samples in the amplitude modulation signal ρ with one or sinusoid samples retrieved from a sine look up table (LUT) 902. To ensure that the reconstructed amplitude modulation signal is properly scaled, a scaler 904 can be used to scale the sinusoid samples before the reconstruction process completes the sample replacement.

After the reconstructed phase modulation signal ρ' is generated by one of the above-described methods, it is converted to a reconstructed analog amplitude modulation signal by the AM path DAC 610. The amplitude modulator 612 amplitude modulates a direct current power supply voltage according to the amplitude variations in the reconstructed analog amplitude modulation signal, thereby generating a reconstructed amplitude modulated power supply signal VDD'(t). Meanwhile, the PM path DAC 616 converts the digital phase modulation signal θ into a constant-amplitude analog phase modulation signal. The phase modulator 618 modulates a carrier signal according to angle variations in the constant-amplitude phase modulation signal, to generate a phase modulated carrier signal.

Figure 4:
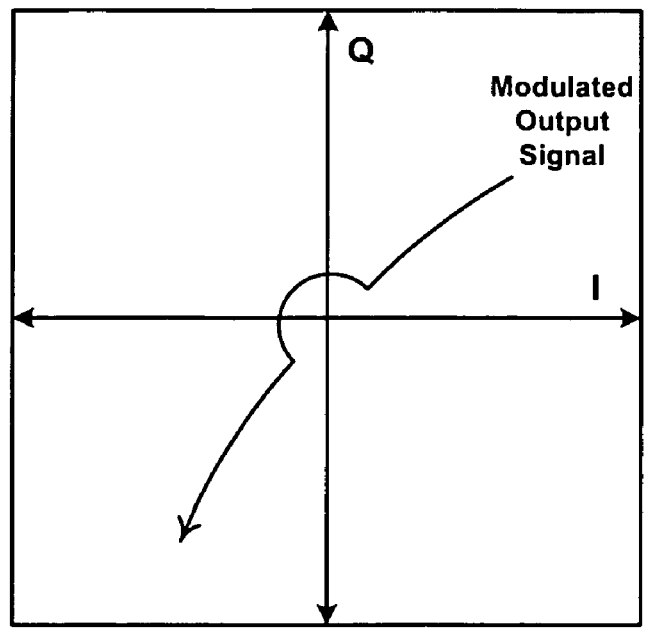
FIG. 4 is a drawing illustrating how an origin-encircling event in a polar modulation transmitter's output signal can arise due to inaccuracies involved in converting a rectangular-coordinate modulation signal to polar coordinates.
Figure 5:
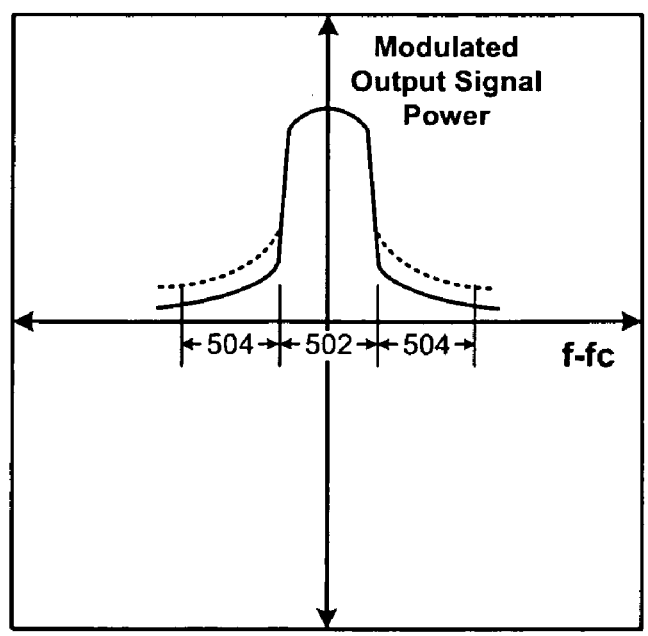
FIG. 5 is a simplified drawing of the output power of a modulated output signal appearing at the output of the power amplifier (PA) of a polar modulation transmitter, highlighting the increase in adjacent channel power caused by origin-encircling events like the one shown in FIG. 4.

The PA 620 is configured to amplify the phase modulated carrier signal while the reconstructed amplitude modulated power supply signal VDD'(t) is applied to the power supply input of the PA 620, which is implemented as a switch-mode type of PA (e.g., a Class D, E or F switch-mode PA) configured for operation in compression. Accordingly, the reconstructed amplitude modulation contained in the reconstructed amplitude modulated power supply signal VDD'(t) is superimposed in the modulated output signal as the phase modulated carrier signal is amplified by the PA 620. Because the amplitude modulation signal had been previously reconstructed to have zero magnitudes in the temporal vicinities of detected phase reversals (or detected near phase reversals), origin-encircling events, like the one shown in FIG. 4, are avoided. The result is an decrease in ACLR compared to if no reconstruction had been previously applied.

Although the present invention has been described with reference to specific embodiments thereof, these embodiments are merely illustrative, and not restrictive, of the present invention. For example, whereas the various exemplary embodiments have been described in terms of hardware (i.e., circuits), those of ordinary skill in the art will appreciate and understand that the functions performed by the various circuits, including, for example, the phase peak detector 614 and the AM reconstruction circuit 606, can be alternatively performed using software techniques, or a combination of hardware and software techniques. For these reasons, the scope of invention should not be limited to the specifically disclosed exemplary embodiments, but should be limited only by what is set forth in the appended claims.

What is claimed is:

1. A polar modulation transmitter, comprising:
    a symbol generator configured to generate rectangular-coordinate modulation symbols;
    a rectangular-to-polar converter configured to generate an amplitude modulation signal containing discrete-time amplitude samples and an angle modulation signal containing discrete-time angle samples from said rectangular-coordinate modulation symbols; and
    an amplitude modulation reconstruction circuit configured to reconstruct samples in said amplitude modulation signal that correspond to a phase reversal or a near phase reversal detected in samples of said angle modulation signal.

2. The polar modulation transmitter of claim 1, further comprising a phase peak detector circuit configured to detect said phase reversal or said near phase reversal represented in samples of said angle modulation signal.

3. The polar modulation transmitter of claim 1 wherein said amplitude modulation reconstruction circuit is configured to reconstruct samples of said amplitude modulation signal by forcing values of one or more samples of said amplitude modulation signal to zero magnitude.

4. The polar modulation transmitter of claim 3 wherein said amplitude modulation reconstruction circuit is further configured to reconstruct samples of said amplitude modulation signal by reducing a sample-to-sample slew rate in said amplitude modulation signal.

5. The polar modulation transmitter of claim 1, further comprising a look up table coupled to said amplitude modulation reconstruction circuit configured to store samples of a piecewise function, wherein said amplitude modulation reconstruction circuit is configured to replace samples of said amplitude modulation signal with samples of said piecewise function.

6. The polar modulation transmitter of claim 5 wherein said piecewise function comprises a piecewise sinusoidal function.

7. The polar modulation transmitter of claim 1, further comprising a low-pass filter configured to filter a reconstructed amplitude modulation signal produced by said amplitude modulation reconstruction circuit, to prevent spectral regrowth caused by reconstructing said amplitude modulation signal.

8. A method of reconstructing an amplitude modulation signal in a polar modulation transmitter, comprising:
    detecting a phase reversal or a near phase reversal represented in samples of a discrete-time angle modulation signal in a phase modulation path of a polar modulation transmitter; and
    reconstructing samples in a discrete-time amplitude modulation signal in an amplitude modulation path of the polar modulation transmitter corresponding to the detected phase reversal or the detected near phase reversal represented in samples of said discrete-time angle modulation signal, to produce a reconstructed amplitude modulation signal.

9. The method of claim 8 wherein reconstructing samples in said discrete-time amplitude modulation signal comprises forcing values of one or more samples in said discrete-time amplitude modulation signal to zero magnitude.

10. The method of claim 9 wherein reconstructing samples in said discrete-time amplitude modulation signal includes controlling a slew rate of the reconstructed amplitude modulation signal.

11. The method of claim 8 wherein reconstructing samples in said discrete-time amplitude modulation signal comprises replacing samples in said discrete-time amplitude modulation signal with samples of a piecewise function.

12. The method of claim 11 wherein said piecewise function comprises a piecewise sinusoidal function.

13. The method of claim 8, further comprising filtering said reconstructed amplitude modulation signal to prevent spectral regrowth caused by reconstructing said amplitude modulation signal.

14. A polar modulation transmitter, comprising:
    means for generating a discrete-time angle modulation signal and a discrete-time amplitude modulation signal; and
    means for reconstructing samples in said discrete-time amplitude modulation signal that correspond to samples in said angle modulation signal representing a phase reversal or a near phase reversal.

15. The polar modulation transmitter of claim 14, further comprising means for detecting samples in said discrete-time angle modulation signal representing the phase reversal or the near phase reversal.

16. The polar modulation transmitter of claim 14 wherein said means for reconstructing samples in said discrete-time amplitude modulation signal comprises means for forcing values of one or more samples in said discrete-time amplitude modulation signal to zero magnitude.

17. The polar modulation transmitter of claim 14 wherein said means for reconstructing samples in said discrete-time amplitude modulation signal comprises means for adjusting a slew rate of said discrete-time amplitude modulation signal.

18. The polar modulation transmitter of claim 14 wherein said means for reconstructing samples in said discrete-time amplitude modulation signal comprises means for replacing samples in said discrete-time amplitude modulation signal with samples of a piecewise function.

19. The polar modulation transmitter of claim 18 wherein said piecewise function comprises a piecewise sinusoidal function.

20. The polar modulation transmitter of claim 14, further comprising means for preventing spectral regrowth caused by reconstructing said discrete-time amplitude modulation signal.

* * * * *